(12) United States Patent
Hofstetter et al.

(10) Patent No.: US 8,326,010 B2
(45) Date of Patent: Dec. 4, 2012

(54) SYSTEM AND METHOD FOR NUCLEAR MAGNETIC RESONANCE (NMR) TEMPERATURE MONITORING

(75) Inventors: Lorne Wyatt Hofstetter, Latham, NY (US); Thomas Kwok-Fah Foo, Clifton Park, NY (US); Cynthia Elizabeth Landberg Davis, Niskayuna, NY (US); Desmond Teck Beng Yeo, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 199 days.

(21) Appl. No.: 12/946,039

(22) Filed: Nov. 15, 2010

(65) Prior Publication Data
US 2011/0268332 A1 Nov. 3, 2011

Related U.S. Application Data

(60) Provisional application No. 61/330,669, filed on May 3, 2010.

(51) Int. Cl.
*G06K 9/00* (2006.01)
*A61B 5/055* (2006.01)
(52) U.S. Cl. ........................ 382/128; 600/412
(58) Field of Classification Search ........................ None
See application file for complete search history.

(56) References Cited

U.S. PATENT DOCUMENTS

| | | | |
|---|---|---|---|
| 5,207,222 A | 5/1993 | Koizumi et al. | |
| 5,263,482 A | 11/1993 | Leunbach | |
| 5,284,144 A | 2/1994 | Delannoy et al. | |
| 5,323,779 A | 6/1994 | Hardy et al. | |
| 5,327,884 A | 7/1994 | Hardy et al. | |
| 5,433,717 A | 7/1995 | Rubinsky et al. | |
| 5,462,055 A | 10/1995 | Casey et al. | |
| 5,492,122 A | 2/1996 | Button et al. | |
| 5,711,300 A * | 1/1998 | Schneider et al. | 600/412 |
| 5,916,161 A | 6/1999 | Ishihara et al. | |
| 5,984,881 A | 11/1999 | Ishibashi et al. | |
| 6,194,899 B1 | 2/2001 | Ishihara et al. | |
| 6,773,408 B1 | 8/2004 | Acker et al. | |
| 6,823,216 B1 | 11/2004 | Salomir et al. | |

(Continued)

FOREIGN PATENT DOCUMENTS
WO  WO2006055829 A1  5/2006
(Continued)

OTHER PUBLICATIONS

SB Reeder, CA McKenzie, AR Pineda, H Yu, A Shimakawa, AC Brau, BA Hargreaves, GE Gold, JH Brittain. Water-Fat Separation with IDEAL Gradient-Echo Imaging. J. Magn. Reson. Imaging May 2007; 25: 644-652.*

(Continued)

*Primary Examiner* — Chan S Park
*Assistant Examiner* — Nancy Bitar
(74) *Attorney, Agent, or Firm* — Eileen W. Gallagher

(57) ABSTRACT

The invention provides a method for a multi-echo acquisition technique capable of obtaining separate water only and fat only images in anatomies having large time-varying phase disturbances. This multi-echo technique is also useful in anatomies where magnetic field inhomogeneity is significant. Also provided is a system, which is capable of producing a reconstructed complex water image whose phase component maintains the temperature dependent phase information. Similarly, the reconstructed fat image maintains the phase information pertaining to the time-varying phase disturbances.

20 Claims, 11 Drawing Sheets

U.S. PATENT DOCUMENTS

| | | |
|---|---|---|
| 7,078,903 B2 | 7/2006 | Paliwal et al. |
| 8,024,025 B2 * | 9/2011 | Mallozzi et al. ............. 600/412 |
| 2004/0015071 A1 | 1/2004 | Komura et al. |
| 2004/0039280 A1 | 2/2004 | Wu et al. |
| 2004/0041563 A1 | 3/2004 | Lewin et al. |
| 2005/0070784 A1 | 3/2005 | Komura et al. |
| 2005/0197564 A1 | 9/2005 | Dempsey |
| 2005/0206380 A1 | 9/2005 | Seeber |
| 2006/0064002 A1 | 3/2006 | Grist et al. |
| 2006/0206105 A1 | 9/2006 | Chopra et al. |
| 2006/0269612 A1 | 11/2006 | Xiang et al. |
| 2007/0238976 A1 | 10/2007 | Ishihara |
| 2007/0293753 A1 | 12/2007 | El-Sharkawy et al. |
| 2008/0058634 A1 | 3/2008 | Roland et al. |
| 2008/0086050 A1 | 4/2008 | Misic et al. |
| 2008/0091099 A1 | 4/2008 | Carasso et al. |
| 2008/0114274 A1 | 5/2008 | Moonen et al. |
| 2008/0146912 A1 | 6/2008 | Richard et al. |
| 2008/0183070 A1 | 7/2008 | Unal et al. |
| 2008/0194941 A1 | 8/2008 | Steinmeyer et al. |
| 2008/0238423 A1 | 10/2008 | Li et al. |
| 2008/0275330 A1 | 11/2008 | Mu et al. |
| 2008/0275331 A1 | 11/2008 | Tseng et al. |
| 2008/0287773 A1 * | 11/2008 | Harvey et al. ................. 600/412 |
| 2009/0012514 A1 | 1/2009 | Moonen et al. |
| 2010/0185081 A1 * | 7/2010 | Soher et al. .................... 600/412 |
| 2012/0071746 A1 * | 3/2012 | Vortman et al. ............... 600/411 |

FOREIGN PATENT DOCUMENTS

| | | |
|---|---|---|
| WO | WO2008137495 A1 | 11/2008 |
| WO | WO2008152411 A1 | 12/2008 |

OTHER PUBLICATIONS

Kuroda et al., "Temperature Mapping Using the Water Proton Chemical Shift: A Chemical Shift Selective Phase Mapping Method", MRM, vol. 38, pp. 845-851, 1997.

Ishihara et al., "A Precise and Fast Temperature Mapping Using Water Proton Chemical Shift", MRM, vol. 34, pp. 814-823, 1995.

* cited by examiner

SYSTEM AND METHOD FOR NUCLEAR MAGNETIC RESONANCE (NMR) TEMPERATURE MONITORING

CROSS-REFERENCE TO RELATED APPLICATIONS

This application claims priority to U.S. provisional patent application No. 61/330,669 filed May 3, 2010; the disclosure of which is incorporated herein by reference in its entirety

BACKGROUND

Magnetic Resonance (MR) imaging often applies thermometry for the purpose of three-dimensional temperature imaging, and for monitoring local specific absorption rate (SAR) to evaluate thermal risk in regular MRI scans, and for monitoring thermal therapy. More specifically, thermal therapy is often used for tumor ablation in cancer treatment including cancers of the breast, prostate, liver, kidney, and brain. In each case, ablation is dependent on reliable volumetric measurement of temperature to guide heating which may be accomplished with MR imaging. However, the method is susceptible to drift in the imaging magnetic field as well as patient motion, both of which must be accounted for and corrected to improve efficacy of the treatment.

Specifically, thermal changes in substances undergoing MR imaging or Nuclear Magnetic Resonance (NMR) spectroscopy are known to cause spin resonance frequency shifts. Phase difference MR imaging techniques have been used to monitor temperature changes in tissues in vivo by measuring the temperature dependent spin resonance frequency shift. The phase difference technique typically only applies to aqueous (water based) tissue and not to adipose (fat) tissue. In adipose (fat) tissue, temperature induced spin resonance frequency shifts are minor when compared with the spin resonance frequency shift seen in aqueous tissue. Therefore, in anatomies containing both water and fat, the fat tissue can cause significant error in the phase difference MR temperature measurements. The error is further enhanced in imaging tissues with varying water and fat content such as breast tissue.

One technique commonly used in phase difference temperature mapping is shown in FIG. 1 and involves acquiring two complex images with the same echo-time ($\tau$). As shown, one gradient echo (GRE) image 10 is taken at time ($t_a$). A second GRE image 15 is taken at a later time ($t_b$). The temperature change between time $t_a$ and $t_b$ is computed by taking the phase difference 20 of the two images and dividing the resulting image by the appropriate scaling constants 25, such as by the scaling term, $\alpha\gamma B_0 \tau$, where $\tau$ is the GRE image echo time, $B_0$ is the main magnetic field strength, $\gamma$ is the gyromagnetic ratio of the proton, and $\alpha$ is the temperature dependent shift coefficient ($\alpha=-0.01$ ppm/° C. for water). One method to compute the phase difference 20 is to compute the phase of image 10 and image 15 separately. These separate phase quantities are then subtracted to compute the phase difference. (The phase of complex image 10 and 15 can be computed by taking the arctangent of the imaginary component divided by the real component on a pixel-by-pixel basis.) Another method for computing the phase difference 20 is to multiply image 15 by the complex conjugate (*) of image 10 on a pixel-by-pixel basis. Taking the argument (Arg) of this complex quantity give the phase difference 20. This temperature measurement technique works because the phase of imaged aqueous tissue (muscle, tumor, etc.) changes with temperature. The temperature change map 30 is generated from the processing.

This technique can only measure temperature change in aqueous or water based tissue. In imaged fat, the phase does not change with temperature. In tissue containing both fat and aqueous tissue, the temperature change map accuracy is affected by the presence of fat. Additionally, this technique is not accurate when phase disturbances exist: magnetic field ($B_0$) drift, patient motion, and breathing. Thus, the accuracy of this technique is affected by the presence of fat and time varying phase disturbances.

A second common technique is shown in FIG. 2 using a fat-referenced phase difference temperature mapping. The technique improves upon the two key limitations of the technique illustrated in FIG. 1, namely the technique is less affected by the presence of fat and phase disturbances. In FIG. 2, separate fat images 55, 56 and water images 50, 52 are acquired, wherein the water images 50, 52 at two different measurement points ($t_a$ and $t_b$) experience phase change due to both the temperature induced phase change and non-temperature dependent phase change. The phase change of the fat images, 55 and 56, at two different measurement points ($t_a$ and $t_b$) is due to the non-temperature dependent phase change. The FIG. 2 technique uses the fat signal, 55 and 56, to correct for non-temperature dependent phase disturbances. The phase difference 60 of the water image 50 and fat image 55 at measurement point $t_a$ is calculated and the phase difference 62 of the water image 52 and fat image 56 at measurement point $t_b$ is calculated. The phase difference measurements, 60 and 62, are processed by the summer 65, which subtracts the phase difference of water and fat taken at measurement point $t_a$ from the phase difference of water and fat taken at measurement point $t_b$. The output of the summer operator 65 is scaled 25, such as by the scaling term, $\alpha\gamma B_0 \tau$. From the scaling 25, the temperature change map is generated 70.

Accurate and complete fat water separation is important for this technique to produce accurate temperature maps in anatomies containing fat. If separation is not complete, referenced technique will produce significant error. In one example, the present technique uses a spoiled gradient echo imaging sequence (SPGR) with frequency selective suppression pulses to obtain the separate fat and water images. As noted, time-dependent phase disturbances and main magnetic field ($B_0$) inhomogeneity adversely affects the quality of this type of fat water separation. This technique is therefore limited in another regard because it relies on the assumption that there is a tissue component of fat and water in each imaging voxel. In the human body, fat and water tissue is generally heterogeneously distributed and a fat-reference in every imaged pixel cannot be relied upon.

Some limitations of this second technique include scenarios when time-varying phase disturbances are large or significant main magnetic field ($B_0$) inhomogeneity exists in the imaged region, whereby accurate and complete fat-water separation is poor. This results in inaccurate temperature maps. Furthermore, the reference signal (fat) must be present in every voxel for reference correction to work.

Referring to FIG. 3, another conventional temperature mapping technique, technique 3, is depicted wherein fat-referenced temperature mapping is accomplished using an IDEAL algorithm. The IDEAL temperature mapping algorithm is used to produce the separate fat and water images used in certain fat-referenced thermometry. IDEAL is a technique that acquires multiple images ($I_1$, $I_2$, $I_3$), at difference echo times ($\tau_1$, $\tau_2$, $\tau_3$) at two different time intervals $t_a$, 105 and $t_b$, 110. The IDEAL algorithm, 115 and 145, employs an iterative processing 120 to compute two different phase maps ($\psi_o$) from images acquired at time $t_a$ and $t_b$ 125, 140 that are used with an algorithm such as the linear least squares approach algorithm 130 to estimate the separate water, 150 and 152, and fat, 155 and 156, signal components. IDEAL, as well as the whole class of multi-echo techniques, is particularly suited for accurate fat-water separation when significant magnetic field inhomogeneity exists.

The thermometry technique of FIG. 3 differs from the technique illustrated in FIG. 2 by the way the separate water images, 150 and 152, and fat images, 155 and 156, are obtained. FIG. 3 uses multiple images, 105 and 110, and then IDEAL algorithm post-processing, 115 and 145, to obtain the reconstructed fat images, 155 and 156, and water images, 150 and 152.

Although IDEAL algorithm processing can produce completely separated water and fat magnitude images, the phase information is affected by the iterative step 120 in algorithms 115 and 145. Temperature information is contained in the phase images, and step 120 affects the accuracy of any temperature measurements obtained from IDEAL reconstructed images. In the iterative step 120, the phase map $\psi_o(t_a)$ 125 is computed from the 3 images 105, and the phase map $\psi_o(t_b)$ 140 is computed from a different 3 images 110. Once the phase map 125, 140 is processed, the water and fat images 150, 152, 155, 156 are reconstructed.

The reconstructed water and fat images 150, 152, 155, and 156 are complex valued and thus have phase components. The phase of these reconstructed images, 150 and 155, is affected by the phase map ($\psi_o$), 125 and 140, that is produced in each iterative step 120. When applying the IDEAL algorithm, 115 and 145, at time points $t_a$ and $t_b$, two different phase maps $\psi_o(t_a)$ 125 and $\psi_o(t_b)$ 140 are used for the reconstruction of the images, namely before temperature change ($t_a$) and after temperature change ($t_b$). When recalculating the phase map, 125 and 140, at each measurement point, phase due to temperature change is interpreted as magnetic field inhomogeneity and is removed from the reconstructed water image 152. As a result the IDEAL algorithm loses the important phase information that is used to computed temperature change map.

Similar to the technique shown in FIG. 2, the phase difference 60 of the water image 150 and fat image 155 at measurement point $t_a$ is calculated and the phase difference 62 of the water image 152 and the fat image 156 at measurement point $t_b$ is calculated. The phase difference measurements, 60 and 62, are processed by the arithmetic operator 65. The output of the arithmetic operator 65 is scaled by the scaling factor ($\alpha\gamma B_0\tau_2$) 125 and the corresponding temperature change map is generated 160.

The IDEAL algorithm can produce fairly accurate water and fat magnitude images under certain circumstances. However, when used for temperature mapping, IDEAL processing recalculates the phase map ($\psi_o$) at each measurement point (t), and as a result the temperature dependent phase information of the water image is lost when the phase map is recalculated.

An alternative fat-referenced configuration mapping is shown in the flow diagram in FIG. 4. Similar to the system processing of FIG. 2, the water images, 50 and 52, and fat images, 55 and 56, from two time periods $t_a$ and $t_b$ are obtained for processing. One detail of the FIG. 4 technique that deviates from the technique of FIG. 2, is that the phase difference between fat images, 55 and 56, at time points $t_b$ and $t_a$ respectively and water images, 50 and 52, at time points $t_b$ and $t_a$ respectively is computed. In addition, before the phase difference 60 of the fat images 55, 56 is subtracted from the phase difference 60 of the water images, 50 and 52, via the summer 145, the phase difference map of the reference images of the fat images, 55 and 56, is subjected to a weighted polynomial fit to a 2D surface 175. The difference between the phase difference of the water images and the polynomial fitting 175 of the phase difference fat images is calculated in the arithmetic operator 145. The output of the summer is subject to scaling 25 and the temperature change map 180 is computed.

The technique of FIG. 4 is still plagued with the key problem facing the FIG. 2 technique, namely the use of frequency selective pulses can fail to produce fat only images and water only images. As was detailed herein, this leads to significant temperature measurement errors.

As an example, the disadvantage of the FIG. 4 technique occurs when large time-varying phase disturbances are present, and/or significant main magnetic field inhomogeneity exists, wherein accurate and complete fat-water separation is poor and results in inaccurate temperature maps.

In summary, the prior techniques of FIGS. 1, 2, and 4 are unable to accurately produce water only and fat only images when time-varying phase disturbances and/or large magnetic field inhomogeneity is present in the anatomy of interest. Fat signal in the water image confounds the basic phase difference technique for the FIG. 1 technique. Fat signal in the water image introduces errors in the fat-referenced temperature mapping technique such as in the FIG. 2 and FIG. 4 technique. Also, water signal in the fat image cause temperature measurement errors for the techniques of FIGS. 2 and 4.

The FIG. 3 technique employs the IDEAL algorithm with a multi-echo acquisition fat-water separation method to obtain water only and fat only images. This technique produces good fat and water magnitude images. However, thermometry measurements depend on quality of phase images, not quality of magnitude images, and phase images produced by method shown in FIG. 3 are not adequate for accurate thermometry. IDEAL reconstructed images cannot reliably be used for thermometry because estimation of the resonance offset due to field inhomogeneity in the iterative step will remove the temperature dependent phase information from the phase of the reconstructed water image.

What are needed therefore are systems and methods that alleviate the noted disadvantages of the state of the art techniques described above.

BRIEF DESCRIPTION

In accordance with one exemplary embodiment, the present disclosure refers to temperature monitoring systems and methods that are integrated into the temperature maps of therapeutic treatment systems.

One embodiment relates to a method for processing a temperature change map of an object subjected to magnetic resonance (MR) imaging. The object may be a person or an animal or an object and may involve the entire body or be limited to a certain area of the body such as head region, spine, joints, abdomen, breast, or pelvic region or may target specific organs and tissues such as blood vessels, heart, or brain.

The method comprises generating l series of k MR images (S), said images each with echo times ($\tau$) varied such that fat and water images can be generated, where, l is an integer equal to or greater than one, k is an integer equal to or greater than two, and each series of MR images is acquired at a time point (t), and echo time $\tau_o$ denotes an average or median echo time of images (S) in each series (l). The method further comprises obtaining a reference phase map image ($\hat{\psi}$) of the object wherein the phase map is a static image representing magnetic field inhomogeneity of the object at a single time point ($t_a$), and applying a reconstruction algorithm to each series (l) of MR images (S) to construct a water image ($\hat{W}$) and a fat image ($\hat{F}$) for the object for each series (l). The method further comprises generating temperature map from water images and fat images wherein said temperature map depicts temperature change ($\Delta T$) relative to a reference temperature ($T_{ref}$) or an absolute temperature ($T_{absolute}$) of said object.

In one embodiment, system is provided to compute a temperature Change map from image data acquired from a magnetic resonance imaging (MRI) device equipped with a heat delivery device. The system comprises a controller coupled to the MRI device and the heat delivery device, capable of controlling the operation of the MRI device and heat delivery device and a processor coupled to the controller. The processor is capable of obtaining two or more images of an object, positioned within the MRI device, at two or more time points, obtaining a reference phase map of the object wherein the phase map is a static image representing magnetic field inhomogeneity of the object at a specific time point, and applying a reconstruction algorithm, of the MR images using the reference phase map to construct one or more water images and optionally one or more fat images of the object. The processor is further capable of computing a phase difference output of the water images and optionally computing a phase difference of the fat images, applying a scaling term to the phase difference output; and generating said temperature change map from the phase difference output. A display device for displaying the one or more water images and optionally one or more fat images of the object is also provided. Various other configurations and features are within the scope of the system and methods.

DRAWINGS

These and other features, aspects, and advantages of the present invention will become better understood when the following detailed description is read with reference to the accompanying drawings in which like characters represent like parts throughout the drawings, wherein.

Figure 12:
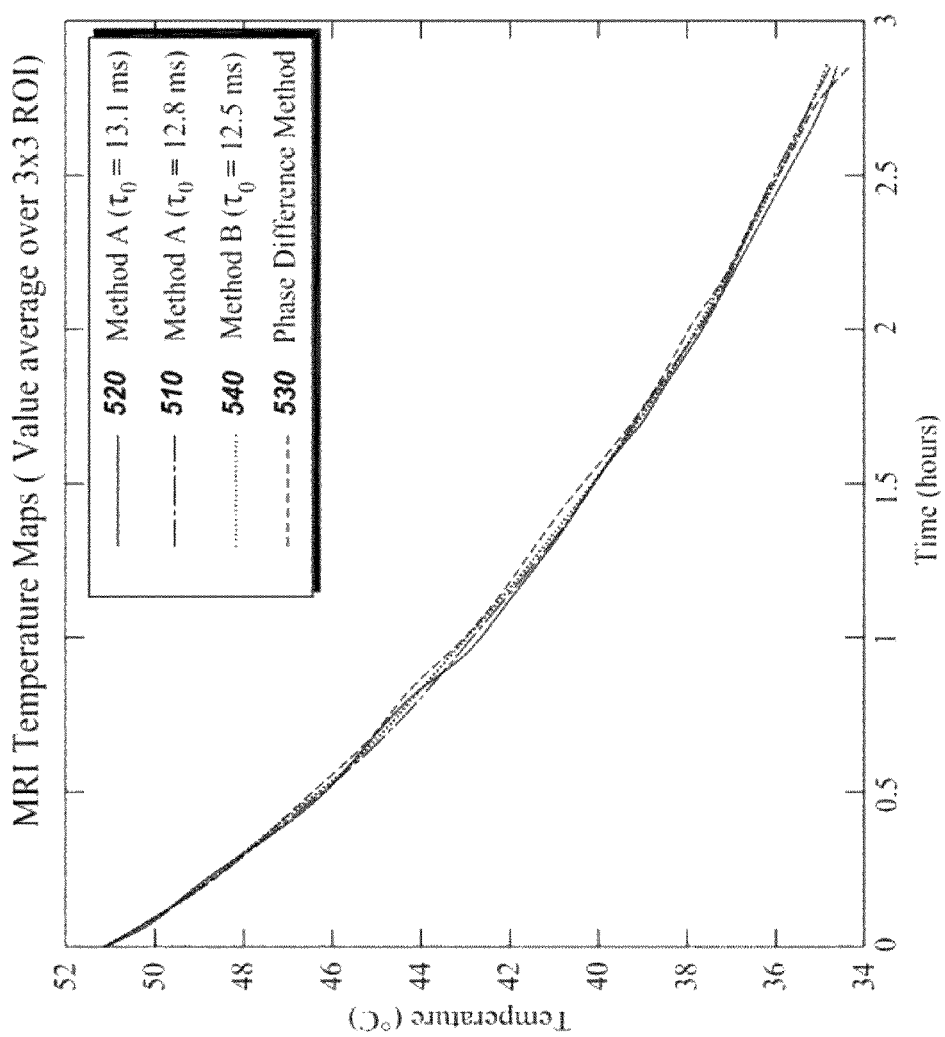

FIG. 12 graphical data from the MRI computed temperate maps showing average value with respect to time.

DETAILED DESCRIPTION

In general, the present invention provides methods and systems for in vivo temperature change measurement in anatomies that contain both fat and water.

Figure 5:
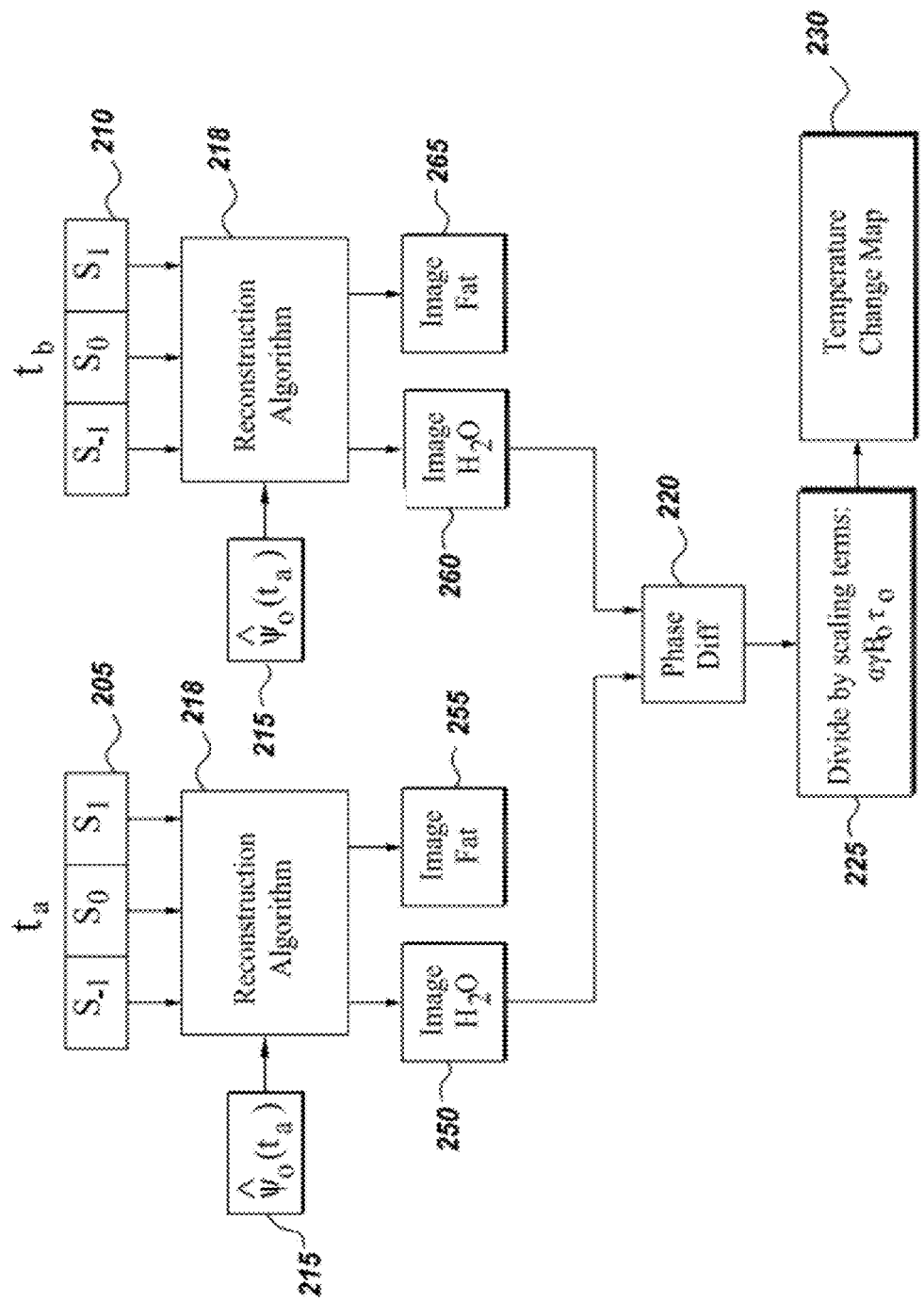
FIG. 5 illustrates a temperature mapping system according to one embodiment.

One embodiment of the invention is directed to a multi-echo acquisition technique capable of obtaining separate water only and fat only images in anatomies having large time-varying phase disturbances. This multi-echo technique is useful in anatomies where magnetic field inhomogeneity is significant and cannot be completely corrected for by linear shimming. Referring to FIG. 5, in the absence of time-varying non-temperature dependent phase disturbances temperature change between $t_a$ and $t_b$ is computed from the phase difference of the reconstructed water images.

Let $t_a$ and $t_b$ represent time points before and after temperature change. Before temperature change $t_a$, two or more MR images at different echo times are acquired 205. In one embodiment, at time $t_a$, three images $\{S_{-1}, S_o, S_1\}$ are acquired at different echo times ($\tau_{-1}, \tau_o, \tau_1$) respectively. A reference phase map image $\hat{\psi}_o$ (in Hertz) 215 is obtained at a single time point $t_a$. The reference phase map image 215 is a measurement of the magnetic field inhomogeneity at time $t_a$. According to one embodiment the reference phase map 215 is a static phase map for the specified time points. While termed a static phase map, there are circumstances where a new static phase map is generated and used for different time points.

After the temperature change $t_b$, two or more MR images at different echo times are acquired 210. In one example, at time $t_b$, three images $\{S_{-1}, S_o, S_1\}$ are acquired at the echo times ($\tau_{-1}, \tau_o, \tau_1$) respectively. Once again three images is just one embodiment, and two or more images may be used.

The images 205 acquired at time $t_a$ and the reference static phase map obtained at time $t_a$, $\hat{\psi}_o$ 215, are used to compute a separate water image 250 before temperature change ($\hat{W}$) using a reconstruction algorithm 218. The images 210 acquired at time $t_b$ and the reference static phase map obtained at time $t_a$, $\hat{\psi}_o$ 215, are used to compute a separate water image 260 after temperature change ($\hat{W}_b$) using a reconstruction algorithm 218. In this example the reconstruction algorithm 218 is the same algorithm however there are circumstances where different algorithms may be used.

The temperature change between time $t_a$ and $t_b$ is computed by taking the phase difference 220 of water image 260 and water image 250 and dividing by the appropriate scaling constants 225, such as by the scaling term [$\alpha\gamma B_0\tau_o$] where $\tau_o$ is the echo time of image $S_o$, $B_0$ is the main magnetic field strength, $\gamma$ is the gyromagnetic ratio of the proton, and $\alpha$ is the temperature dependent shift coefficient ($\alpha$=−0.01 ppm/° C. for water). This technique works, in aqueous tissue (muscle, tumor etc.), even when fat is located in the anatomy because the water signal and fat signal are cleanly delineated into two separate images. Temperature change map 230 is generated from the processing.

As should be understood, the computations and processing may be performed on a computer, processor, microprocessor, general-purpose processor, field programmable gate array (FPGA), graphics processing unit (GPU), and the related forms of computing devices. Memory components such as disks, RAM, ROM, EEPROM and flash memory are typically coupled to the computing devices for storing and saving data and there are various input/output devices.

Optionally, the separate fat image 255 before temperature change can be computed ($\hat{F}_a$) using the images 205 and the static reference phase map acquired at time $t_a$, ($\hat{\psi}_o$) 215. The images 210 acquired after the temperature change at $t_b$ and the static reference phase map acquired at $t_a$, ($\hat{\psi}_o$) 215, can be optionally used to compute separate fat images 265 after the temperature change ($\hat{F}_b$).

The reconstruction algorithm 218 computes the separate water and optional fat images. There are several types of reconstruction algorithms that can be used to produce reconstructed water images whose phase contains all temperature dependent information and fat images whose phase contains information pertaining to phase disturbances.

In the presence of temperature change, Equation 1 models a single voxel of a MR image containing water and fat.

$$S_n = [\rho_w e^{i\gamma B_0 \delta_T \tau_n} + \rho_f e^{i\gamma B_0 \delta_{fw} \tau_n}] e^{i(2\pi \psi_o \tau_n + \phi_o)} \quad (1)$$

$S_n$ denotes the complex image for a specific voxel acquired at echo time $\tau_n$. $\rho_w$ and $\rho_f$ denote the magnitude of the water signal and fat signal respectively. $\delta_T$ is the chemical shift of water based matter referenced against water based matter at temperature $T_{ref}$. $\delta_{fw}$ denotes the chemical shift of fat referenced against water at temperature $T_{ref}$. The reference temperature refers to a fixed temperature from which temperature changes may be calculated. In certain embodiments, $T_{ref}$ may be the initial temperature of the object undergoing scanning, such as 37° C. and as such $\delta_{fw}$ would be approximately 3.4 parts per million (ppm). In other embodiments, the $T_{ref}$ may be the temperature measurement of the first scan, in still other embodiments, $T_{ref}$ may be within a specific testing range. $\psi_o$ is the echo time dependent resonance offset due to field inhomogeneity (in Hz) and $\phi_o$ is the resonance offset that is independent of echo time. $\gamma$ is the gyromagnetic ratio and $B_0$ is the static magnetic field strength.

If an estimate for $\psi_o$ is obtained at a single time point ($t_a$) (the static estimate is denoted by $\hat{\psi}_o$, where $\hat{\psi}_o = \psi_o(t_a)$), Equation 1 can be written in the following form, $$\hat{S}_n = [\rho_w e^{i\gamma B_0 (\delta_T + \delta_\psi) \tau_n} + \rho_f e^{i\gamma B_0 (\delta_{fw} + \delta_\psi) \tau_n}] e^{i\hat{\phi}_o} \quad (2)$$

where $$\hat{S}_n = S_n e^{-i 2\pi \sigma \tau_n} \quad (3)$$

and $$\delta_\psi = \frac{2\pi(\psi_o - \hat{\psi}_o)}{\gamma B_0} \quad (4)$$

Since $\hat{\psi}_o$ is obtained at one time $t_a$, $\hat{\psi}_o$ term will not capture all echo-time dependent resonance offsets (also referred to as the static magnetic field map, $B_0$) in images acquired at later times, i.e. after temperature change. Patient motion, susceptibility related phase disturbances, etc. would change $\psi_o$, making $\hat{\psi}_o$ a less accurate estimate for the actual resonance offset. The $\delta_\psi$ term captures this difference between the actual value of $\psi_o$ when the image series was acquired and the value of $\hat{\psi}_o$.

It is also assumed that the static magnetic field map, $B_0$, does not significantly change from time $t_a$ to time $t_b$. This is a reasonable assumption as the local field homogeneity is dependent on the body habitus alone. If one is imaging the same body part, there can be no significant large variations of $B_0$. Respiration is assumed to have a minor perturbation on $B_0$ on the spatial scale being used.

In one embodiment, the system updates the static estimate of $\hat{\psi}_o$ every time a temperature measurement is taken. One cannot simply recalculate a value for $\hat{\psi}_o$ at every measurement point, because the temperature change information being measured will be interpreted as resonance offset due to field inhomogeneity. This is precisely the problem with the state of the art, wherein the resonance offset map is recalculated with each measurement and thus temperature information in the phase of the water image is lost. Although not necessary, temperature measurement accuracy may be improved if the static field map $\hat{\psi}_o$ is adjusted to account for significant changes in field homogeneity due to patient motion including motion caused by respiration and cardiac pumping. Changes in field homogeneity may also be affected by time-varying changes in the bulk magnetic susceptibility of the tissue. These time-varying changes in the bulk magnetic susceptibility may be caused by temperature change.

In one such correction method, a static 3D magnetic susceptibility map may be estimated by applying algorithms to solve an electromagnetic inverse problem where the magnetic flux density is assumed to be equal to the negated gradient of a scalar potential. Alternatively, image segmentation of air, bone, and soft tissue may be performed and magnetic susceptibility values from literature may be assigned to segmented voxels, based on tissue type and tissue temperature, to create a static susceptibility map. Subsequently, rigid body motion parameters, obtained via image registration, may then be applied on the static susceptibility map to obtain a series of 3D dynamic susceptibility maps. The forward problem may then be solved to compute the dynamic field maps.

Another correction method involves registering image intensity slices to an anatomically correct 3D dataset and applying the resultant rigid body motion parameters to the 3D field map. For each set of motion parameters, the respective slice in the transformed 3D field map is resampled and used as the estimate of the dynamic field map.

Detailed herein are two approaches for solving Equation (2) that allow the temperature change to be computed which are designated A and B. In Approach A, three images, each with distinct echo times, are used. The echo timing is chosen such that the phase of the fat signal is shifted by an odd multiple of 180° for each image. One possible echo combination satisfying this condition is where in the first image, the echo occurs when fat and water are in phase. In the second image, the echo occurs when the fat and water are 180° out of phase. In the third image, the echo occurs when fat and water are in phase again. This combination is one example and other embodiments are applicable. The relevant detail is that fat phase shifts by an odd multiple of 180°. Temperature information is obtainable from arithmetic manipulation on the three images and the field map image $\hat{\psi}_o$.

Approach B is more flexible with the choice of echo spacing between images and the number of images acquired, however the solution is computationally intensive. The accuracy of B is also dependent on the selection of echo times. To implement Approach B, two or more images are acquired. The computations by the reconstruction algorithm 218 can be achieved using either the Approach A or Approach B.

According to Approach A, 1 series of three MR images ($S_{-1}$, $S_0$, $S_1$) are acquired with echo times ($\tau_o-\Delta\tau, \tau_o, \tau_o+\Delta\tau$) where, $$\Delta\tau = \frac{\pi(2m-1)}{\gamma B_0 \delta_{fw}} \quad (5)$$

and m is a positive integer and $l \geq 1$. (The smallest error in temperature measurement may be produced when m=1 is chosen. Depending on the image acquisition scheme, values of m larger than 1 may be useful to shorten scan time.) For demonstrative purposes echo time $\tau_o$ was chosen such that water and fat are out-of-phase. However, this technique does not preclude other values of $\tau_o$, and different values will only introduce a constant phase term in the solution of the fat image. Given the echo spacing in Equation (5) where m=1, and the measurement $\hat{\psi}_o$ at time $t_a$, the three images from a given series/are detailed in the following form $$\hat{S}_{-1} = W e^{-i\gamma B_0(\delta_T + \delta_\psi)\Delta\tau} + F e^{-i\gamma B_0 \delta_\psi \Delta\tau} \quad (6)$$

$$\hat{S}_0 = W - F \quad (7)$$

$$\hat{S}_1 = W e^{i\gamma B_0(\delta_T + \delta_\psi)\Delta\tau} + F e^{i\gamma B_0 \delta_\psi \Delta\tau} \quad (8)$$

where $$W = \rho_w e^{i(\gamma B_0(\delta_T + \delta_\psi)\tau_o + \phi_o)} \quad (9)$$

$$F = \rho_f e^{i(\gamma B_0 \delta_\psi \tau_o + \tau_o)} \quad (10)$$

Equations (6-8) are combined in the following way;

$$I_w = \frac{\hat{S}_{-1} + \hat{S}_1}{2} + \hat{S}_0 \quad (11)$$

$$I_f = \frac{\hat{S}_{-1} + \hat{S}_1}{2} - \hat{S}_0 \quad (12)$$

With algebra, the right side of Equations (11) and (12) can be simplified to:

$$I_w = W[\cos(\gamma B_0(\delta_T + \delta_\psi)\Delta\tau) + 1] + F[\cos(\gamma B_0 \delta_\psi \Delta\tau) - 1] \quad (13)$$

$$I_f = W[\cos(\gamma B_0(\delta_T + \delta_\psi)\Delta\tau) - 1] + F[\cos(\gamma B_0 \delta_\psi \Delta\tau) + 1] \quad (14)$$

As shown in equations (13) and (14), the phase information for each component is contained in the W and F variables; the cosine terms are real. Thus in voxels without fat (|F|=0) the phase of $I_w$ will exactly equal to the phase of the water signal W. In voxels without water (|W|=0) the phase of $I_f$ will exactly equal to the phase of the fat signal F. In voxels where there is a mixture of water and fat, the phase of $I_w$ and the phase of $I_f$ will not represent the exact phase of W and F. Choosing the echo spacing $\Delta\tau$ to be small will minimize this inaccuracy. When $\Delta\tau$, $\delta_\psi$, and $\delta_T$ are small, the argument of the cosine terms in equation (13) and (14) is close to zero, and to first order, the cosine terms are equal to one. Using this approximation equations (13) and (14) now become.

$$I_w \approx 2W \quad (15)$$

$$I_f \approx 2F \quad (16)$$

Thus, $I_w$ and $I_f$ are estimates for the reconstructed water image and reconstructed fat images scaled by a factor of two. The reconstructed water image ($\hat{W}$) and reconstructed fat image ($\hat{F}$) is defined as follows:

$$\hat{W} = \frac{I_w}{2} \quad (17)$$

$$\hat{F} = \frac{I_f}{2} \quad (18)$$

The accuracy of the phase information in the reconstructed water image ($\hat{W}$) will be proportional to the fraction of the voxel that is comprised of water. Similarly the accuracy of the phase information in the reconstructed fat image ($\hat{F}$) will be proportional to the fraction of the voxel that is comprised of fat. The ratio of the signal intensity of water to fat can be used to compute an accuracy map for the phase of the water image and for the phase of the fat image.

In the Approach B calculation, 1 series of k MR images (S) are acquired, where $k \geq 2$ and $l \geq 1$. Echo time spacing between images can be arbitrary. (Echo spacing choice will affect accuracy but technique is general enough and can get solution for any echo spacing.) A set echo-time ($\tau_o$) for the data is defined where $\tau_o$ denotes an average or median echo time of images (S) and the echo times ($\tau_n$) for all n images can be written as ($\tau_O+\Delta\tau_1, \tau_o+\Delta\tau_2, \ldots +\tau_o+\Delta\tau_{n-1},\tau_o+\Delta\tau_n$) where $\Delta\tau_n = \tau_n - \tau_o$. With the measurement of $\hat{\psi}_o$ taken at fixed time $t_a$ Equation 1, for the $n_{th}$ image can be written as, $$\hat{S}_n = W e^{i\gamma B_0(\delta_T + \delta_\psi)\Delta\tau_n} + (e^{i\gamma B_0 \delta_{fw}\tau_n}) F e^{i\gamma B_0 \delta_\psi \Delta\tau_n} \quad (19)$$

If $\Delta\tau_n$, $\delta_\psi$, and $\delta_T$ are small a zeroth order approximation of the exponential terms having a small argument is taken. Equation (19) can be modeled as follows;

$$\hat{S}_n \approx W + (e^{i\gamma B_0 \delta_{fw}\tau_n}) F \quad (20)$$

The two complex valued unknowns W and F in Equation 20 can be solved for. If only two images are acquired (n=2) then W and F in Equation 20 can be solved for directly. Equation 20 is an approximation of Equation 19. The solution for W and F in Equation 20 is denoted as $\hat{W}$ and $\hat{F}$ respectively. If more than two images are acquired (n>2) an over-determined system of equations results, where there are more equations than unknowns. When n>2 W and F can be estimated using a least squares approach. Similar to the n=2 case, the least squares solution is an estimation for W and F, this estimated solution is denoted as $\hat{W}$ and $\hat{F}$ respectively. Other methods of solving over determined systems may provide a more robust, accurate solution than the least squares approach.

Figure 4:
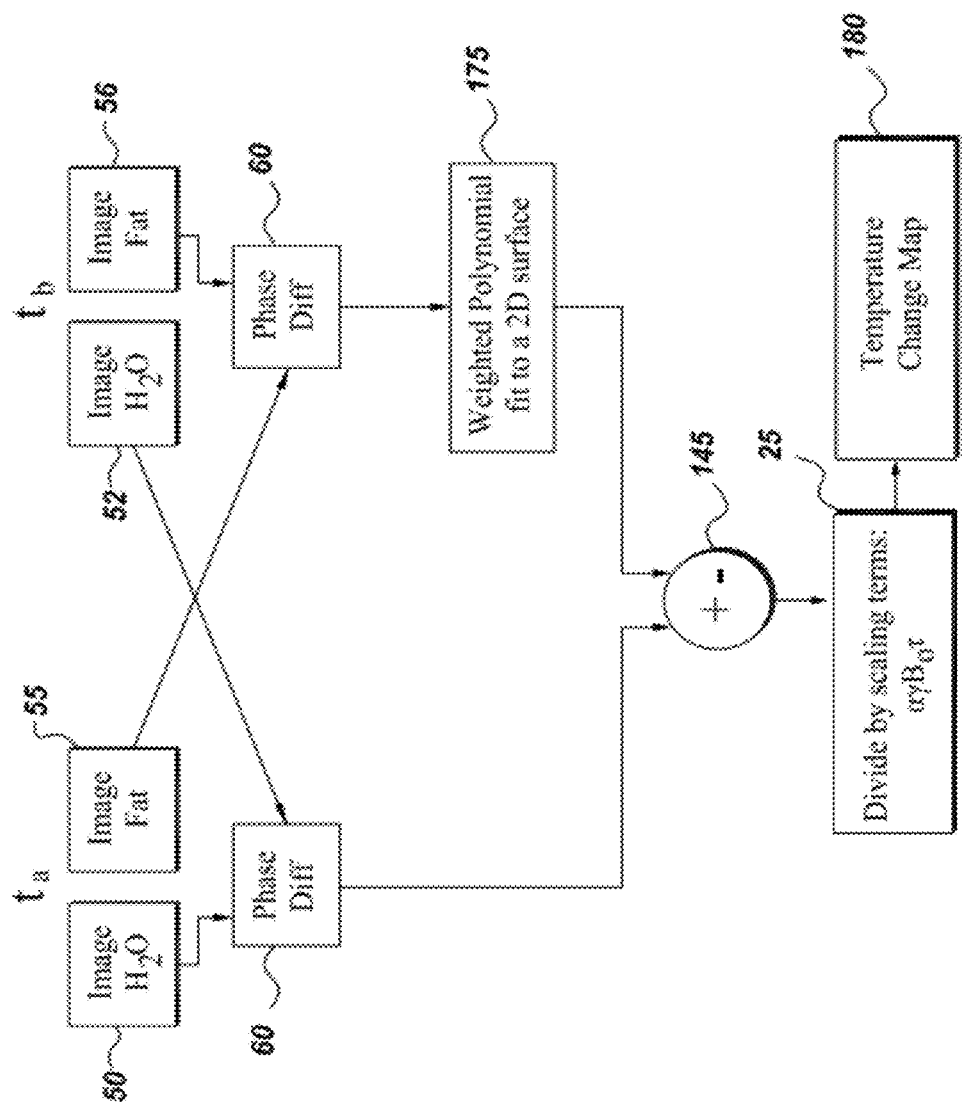
FIG. 4 shows a prior art diagrammatic view of a fat-referenced temperature mapping technique with polynomial fitting of phase images.

Unlike the techniques described above in FIGS. 1, 2, and 4 the embodiment described in FIG. 5 provides a method to produce water only and fat only images. In the technique shown in FIG. 1, fat signal in the water image will introduce errors in the temperature mapping technique. In the technique shown in FIGS. 2 and 4, water signal in the fat image will cause temperature measurement error for these techniques.

Figure 2:
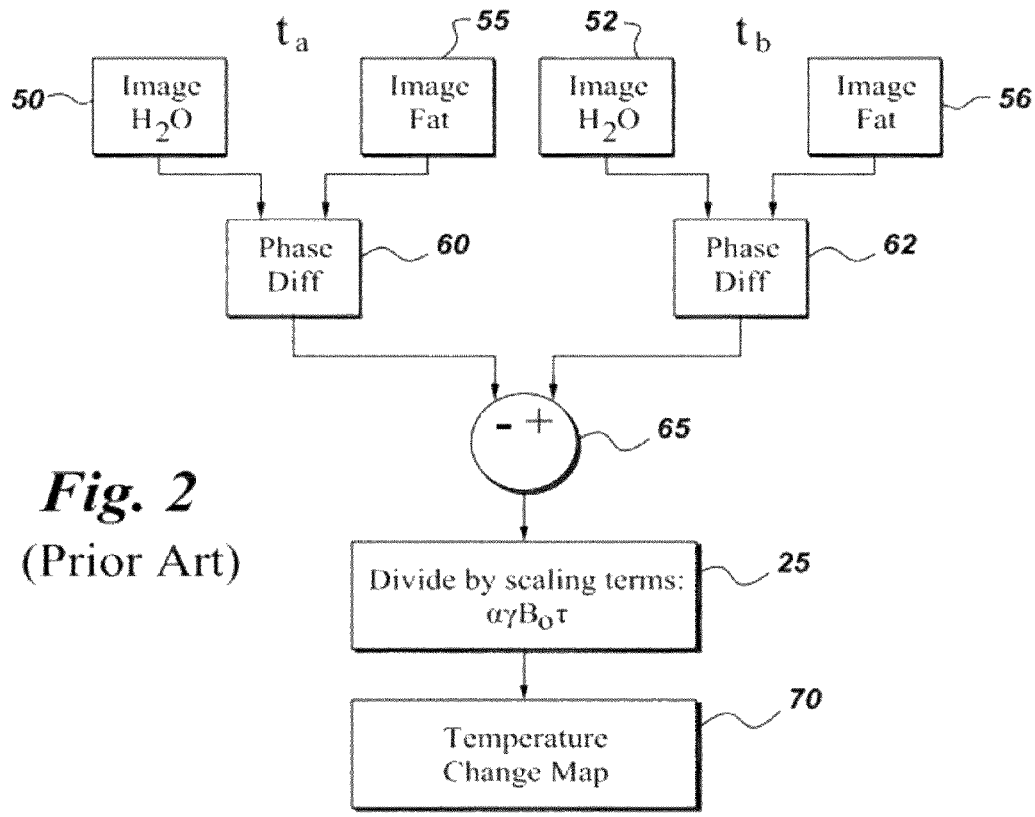
FIG. 2 shows a prior art diagrammatic view of a fat-referenced phase difference temperature mapping technique.
Figure 3:
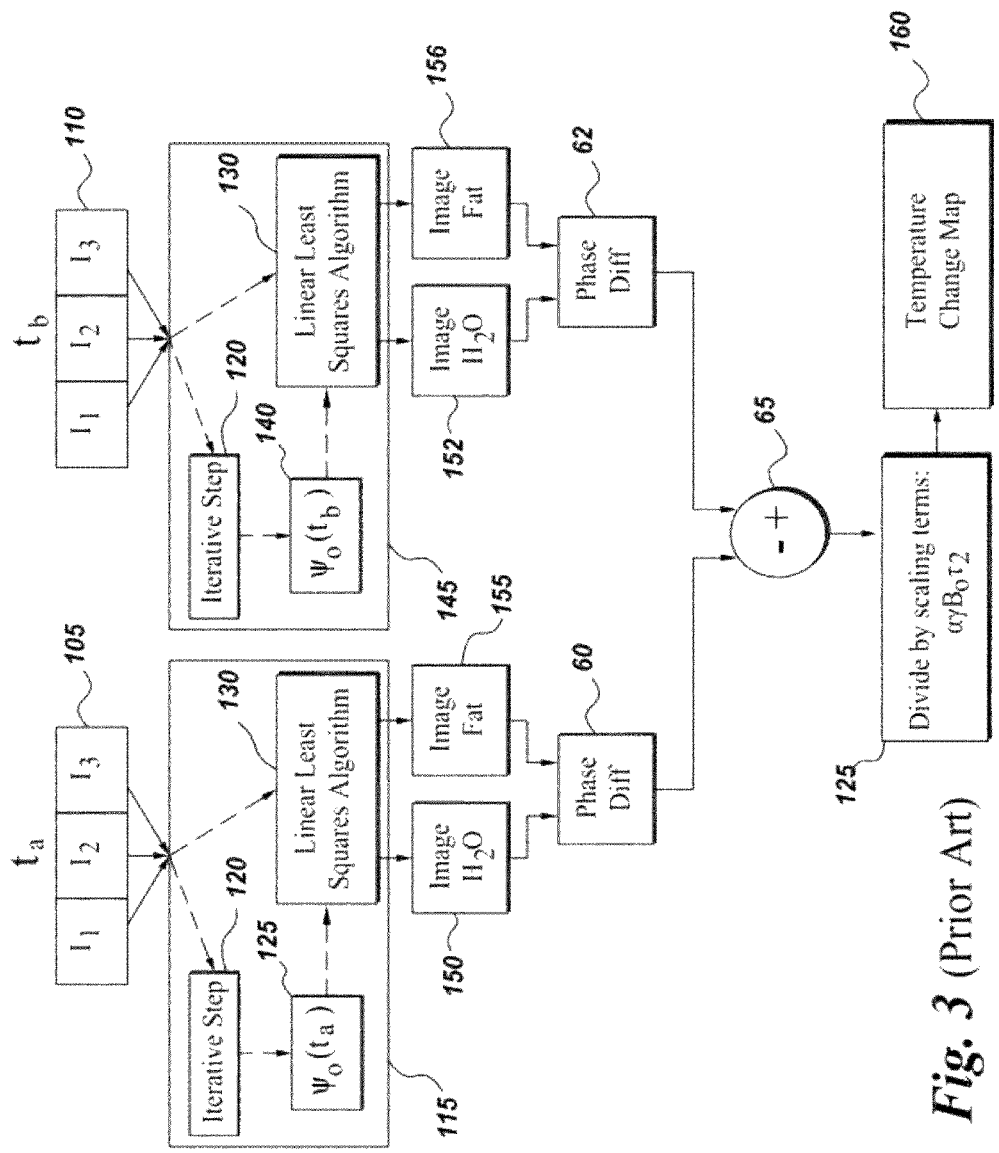
FIG. 3 shows a prior art diagrammatic view of a fat-referenced temperature mapping technique using an IDEAL algorithm.

Furthermore in contrast to the prior art IDEAL algorithm technique described above in FIG. 3, one embodiment described in FIG. 5 produces a reconstructed complex water image whose phase component maintains the temperature dependent phase information as well as a reconstructed fat image, which maintains the phase information pertaining to the time-varying phase disturbances. Further the water only embodiment shown in FIG. 5, provides a process to allow phase difference MR thermometry in tissues that contain a high percentage of fat, which is not obtainable in the techniques described in FIGS. 2 and 4 above.

Figure 6:
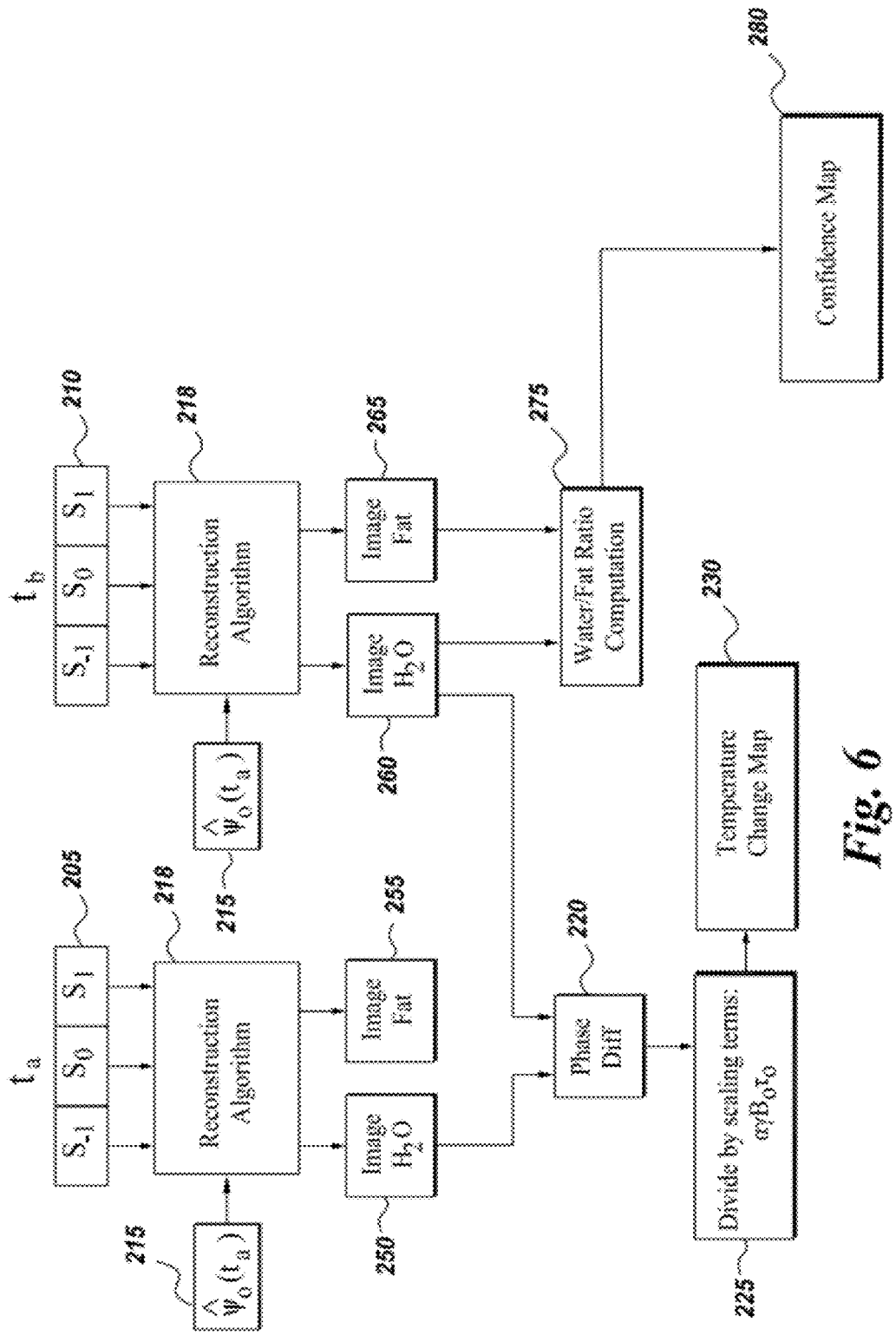
FIG. 6 shows another temperature mapping system with thermometry confidence maps according to another embodiment.

In a certain embodiment, since the accuracy of the temperature maps is a direct function of the water content in the imaged subject, a confidence map of the temperature measurements may be generated. Referring to FIG. 6, the accuracy map of the calculated water image may be used to compute a confidence map 280 for the temperature measurement. As discussed herein, the accuracy of the reconstructed water image for a given voxel is dependent on the fraction of fat that is contained in that voxel. The larger the ratio of fat to water in a given voxel, the less accurate the phase and temperature information of the water images 250 and 260. One method to compute a confidence map 280 is to use the fat-water fraction 275 in each voxel and correlate this to the confidence level for each pixel in the calculated temperature change map.

In multi-echo fat water separation techniques, image noise can affect the accuracy of the phase information in the reconstructed water images 250 and 260, and the reconstructed fat images 255 and 265, and further plays a role in the accuracy of the phase information. Since, accuracy of phase information translates to temperature map accuracy, image noise can also be factored in when the temperature map/confidence map is computed.

Here $\hat{W}_a$ is the water image and $\hat{F}_a$ is the fat image computed from image series acquired at time point $t_a$ before temperature change. $\hat{W}_b$ is the water image and $\hat{F}_b$ is the fat image computed from a different image series at time point $t_b$. $\hat{W}_a^*$ and $\hat{F}_a^*$ denote the complex conjugate of $\hat{W}_a$ and $\hat{F}_a$ respectively. Computation of the temperature change map ($\Delta T$) is described by Equation 21:

$$\Delta T = \frac{\text{Arg}\{\hat{W}_b \hat{W}_a^*\} - C}{\gamma \alpha B_0 \tau_o} \quad (21)$$

where $\alpha$ is the temperature dependent shift coefficient, $\text{Arg}\{\hat{W}_b \hat{W}_a^*\}$ is a phase difference 220 between water images $\hat{W}_b$ and $\hat{W}_a$. In the embodiment where only water images are used for the temperature map calculation as detailed in FIGS. 5 and 6, the variable C is null, and Equation 21 can be written as:

$$\Delta T = \frac{\text{Arg}\{\hat{W}_b \hat{W}_a^*\}}{\gamma \alpha B_0 \tau_o} \quad (22)$$

This embodiment is applicable when there is fat in the anatomy of interest, but non-temperature dependent phase disturbances are minimal. In this case, the fat-reference approach is not necessary, because there are no phase disturbances to correct for. Obtaining a water only image is necessary for phase difference temperature measurement because the fat signal does not exhibit the same temperature dependent phase shift that water signal does.

Even if phase disturbances exist, the embodiment detailed in FIGS. 5 and 6 may be used if other methods are used to correct non-temperature dependent phase disturbances. In one embodiment, as shown in FIG. 6, the computation of a temperature change confidence map 280 is included, which is based on the computed water-fat voxel fraction. Thus the temperature map and confidence map may be displayed simultaneously to the operator monitoring the treatment procedure. This may allow the MR temperature measurement accuracy to be assessed during the treatment.

Figure 7:
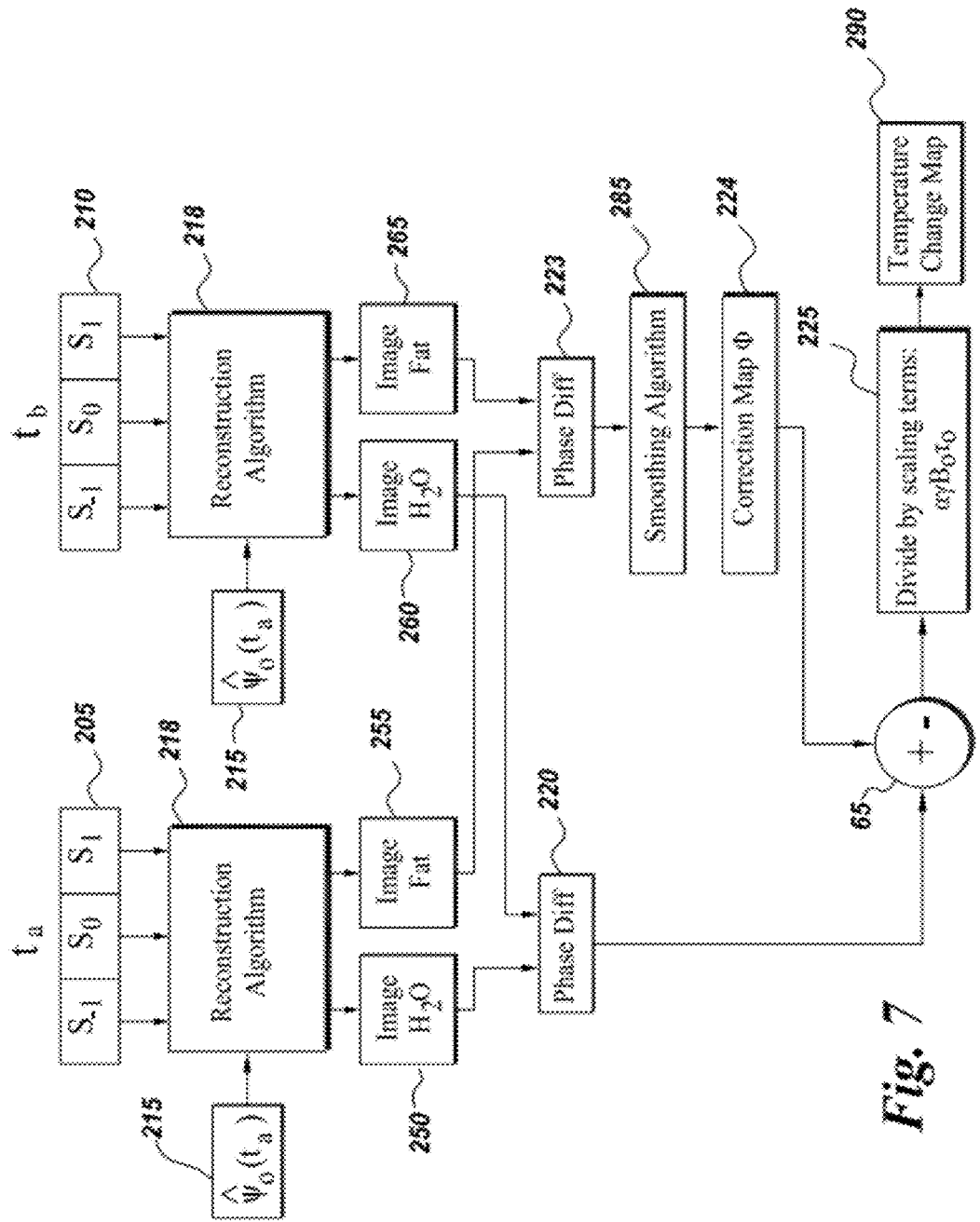
FIG. 7 shows a temperature mapping system in accordance with yet a further embodiment.

Referring to FIG. 7, when time-varying non-temperature dependent phase disturbances exist, the phase difference of the reconstructed water images provides a measurement of both the temperature dependent phase change and non-temperature dependent phase change. A fat-referenced approach may be used to correct for non-temperature dependent phase. The phase difference 223 between the reconstructed fat images 255 and 265 is used to measure the non-temperature dependent phase change. A phase correction map 224 for the non-temperature dependent phase change may be computed from the phase difference 223 of the fat images 255, 265. This correction map 224 is subtracted from the phase difference 220 of the water images 250 and 260, thus isolating the phase change due to temperature.

In FIG. 7, the water images 250 and 260 and fat images 255 and 265, are computed using techniques described previously in FIG. 5 and FIG. 6. The phase difference 220 of the water images 260, 250 are computed. The phase difference 223 of the fat images 265 and 255 is also computed. If fat is not present in all pixels, the smoothing algorithm 285 provides additional processing of the phase difference 223 of the fat image 255 and 265 in order to compute a correction map 224 that may be applied to all pixels and not just those containing fat. A non-temperature dependent phase disturbance correction map 224 is computed for all pixels of the images.

According to one embodiment, the phase disturbance correction map 224 is computed even in voxels that do not contain fat. The phase disturbance correction map 224 is subtracted from the phase difference 220 of the water images 255 and 265 using the summer 65. The result is divided by the appropriate scaling constants 225. This technique produces accurate temperature maps that are corrected for non-temperature dependent phase disturbances. The temperature change map 290 is generated from the processing.

There are a variety of methods that may be used to compute a global phase disturbance correction map 224 from the phase difference of the fat images 223, even when the fat is heterogeneously distributed, for example in breast tissue. One such method is to fit the phase difference of the fat images to a 2D spatially varying polynomial using a weighted least squares approach. The square of the fat magnitude image may be used for the weighting of the least squares algorithm. Other interpolation, extrapolation and regularization approaches may be used to compute the global phase disturbance correction map from the phase difference of the fat images.

Figure 8:
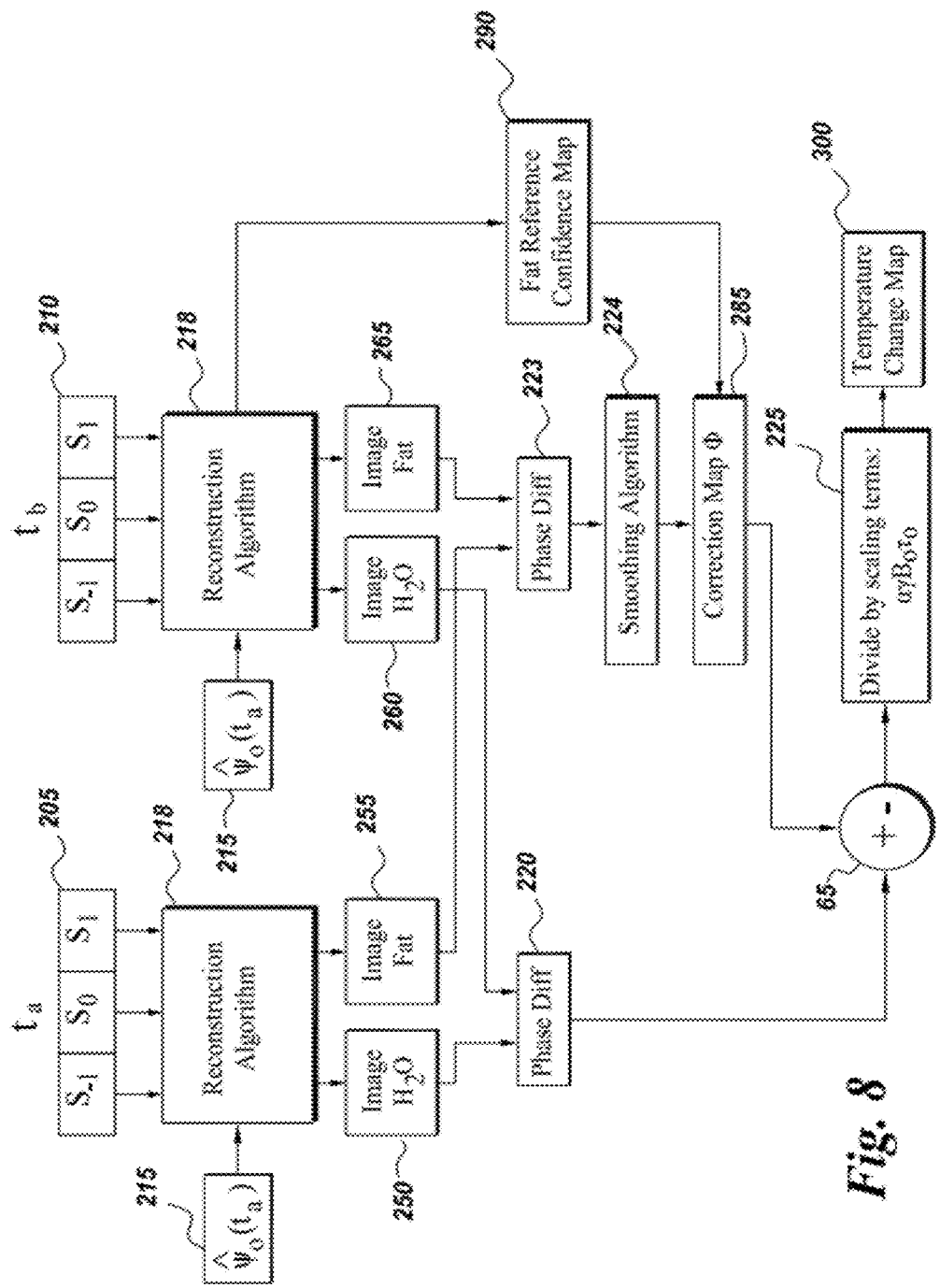
FIG. 8 depicts another embodiment employing a confidence map.

In the fat-referenced embodiment depicted in FIG. 8, the fat phase confidence map 290 may be used as a priori information when computing the global correction map from the phase difference of the fat images. The accuracy of the reconstructed fat image, in a given voxel, is dependent on the fat fraction in that particular voxel. A larger fat to water ratio will increase the accuracy of the non-temperature dependent phase disturbance estimate from the reconstructed fat image. The fat phase confidence map may be used as the weighting metric for any fitting, interpolation, extrapolation, or regularization algorithm when computing the global correction map when fat is heterogeneously distributed.

The fat-referenced embodiment is applicable when there is fat in or surrounding the anatomy of interest. Non-temperature dependent phase disturbances cause significant temperature measurement error in the water only case. Some key applications of fat-referenced thermal mapping include the breast, the prostate, and the liver. The usefulness of this technique is not limited to these regions.

The most basic fat-reference scenario is when there is water and fat in each imaging voxel. In this scenario, the phase disturbance corrected temperature may be computed using Equation 21 where C is the phase difference between fat image $\hat{F}_b$ and fat image $\hat{F}_a$ described by the following equation, $$C = \text{Arg}\{\hat{F}_b \hat{F}_a^*\} \quad (23)$$

where the term $\text{Arg}\{\hat{F}_b \hat{F}_a^*\}$ is the phase difference 223 in FIGS. 7-8. In voxels that do not contain fat, the quantity for C described by Equation 23 will not provide useful phase disturbance correction information in these regions. In tissues where fat and water are heterogeneously distributed, another method is needed to correct for phase disturbance in all voxels and not those just containing fat.

Even when the fat-image is sparsely distributed (heterogeneously distributed), a phase disturbance correction map may be computed from the phase difference of the fat-images. Let Φ represent the phase disturbance correction map where the correction map is computed by spatially interpolating, extrapolating or smoothing the quantity $\text{Arg}\{\hat{F}_b \hat{F}_a^*\}$. Φ may be calculated for all pixels from the heterogeneously distributed fat images. One such method to calculate Φ is to use a least squares method to fit a spatially varying polynomial or function to the quantity $\text{Arg}\{\hat{F}_b \hat{F}_a^*\}$. When fat is not located in each voxel, the phase disturbance corrected temperature map may be computed using Equation 21 where the quantity C is set equal to Φ. Equation (21) with C=Φ will hold, even in voxels where there is no fat.

Absolute temperature measurement is possible using the multi-echo approach. The methods illustrated in FIGS. 5-8 measure temperature changes between images taken at time points $t_a$ and $t_b$. The method depicted in FIG. 9 measures absolute temperature from images taken at a single time point $t_a$.

Multiple images 305 are acquired at different echo times. A reference $B_o$ phase map $\hat{\psi}_o$ 315 is obtained. The chemical shift of fat relative to water $\delta_{fw}$ 317 at a given reference temperature $T_{ref}$ is an input to the fat-water separation reconstruction algorithm 218. The reconstruction algorithm 218 described previously may be used to compute a separate water image $\hat{W}$ 350 and a separate fat image $\hat{F}$ 355. The phase of the water image $\phi_w$ is computed 351 and if phase image has phase wraps phase unwrapping algorithms may be applied 352 to produce a processed phase image $\phi_w'$ 353. The phase of the fat image $\phi_f$ is computed 356 and if phase image has phase wraps, phase unwrapping algorithms may be applied in phase processing step 318 to generate $\phi_f'$ 357. In the case that fat image 355 is heterogeneously distributed, phase processing step 318 includes interpolation, regularization, or smoothing to generate reference in voxels where there is no fat. The output of 357 is subtracted 360 from the processed water phase image 353. This quantity is divided by the appropriate scaling constants 365. To compute the absolute temperature, the reference temperature 301 is added 370 to this quantity. The absolute temperature map 330 is generated from the processing.

Figure 9:
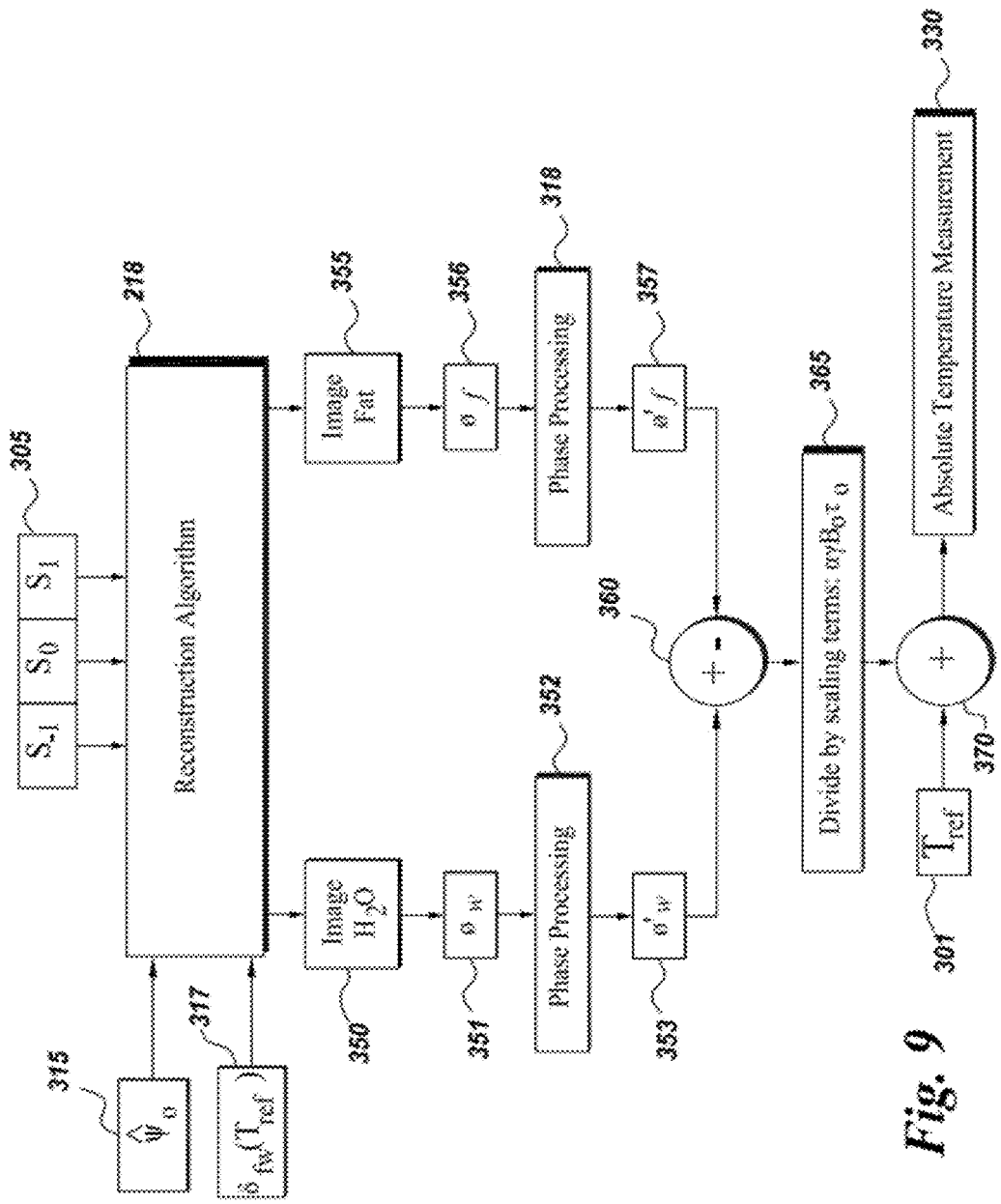
FIG. 9 shows an absolute thermometry system in accordance with another embodiment.

The absolute temperature measurement of FIG. 9 computes the absolute temperature measurement by using the fat phase image 357 as a direct reference. The absolute temperature measurement is show in Equation 24, $$T_{absolute} = \frac{\phi_w' - \phi_f'}{\gamma \alpha B_0 \tau_o} + T_{ref} \quad (24)$$

where $\phi_w'$ is the processed water phase image, and $\phi_f'$ is the processed fat phase image. The water phase $\phi_w$ and fat phase $\phi_f$ is computed by taking the phase of the complex quantities $\hat{W}$ and $\hat{F}$ respectively. Phase of a complex quantity is computed by taking the arctangent of the imaginary component divided by the real component.

In certain embodiment, a therapeutic treatment system is provided for which integrates the temperature map processing with a magnetic resonance imaging (MRI) device equipped with a heat delivery device. The system comprises a controller coupled to the MRI device and the heat delivery device, and which is capable of controlling the operation of the MRI device and heat delivery device. The system also comprises a processor coupled to the controller and capable of, obtaining two or more images of an object, positioned within the MRI device, at two or more time points, obtaining a reference phase map of the object wherein the phase map is an image representing magnetic field inhomogeneity of said object at a specific time point, and applying a reconstruction algorithm, of the MR images, using the reference phase map to construct one or more water images and optionally one or more fat images of the object. The processor is further capable of computing a phase difference output of the water images and optionally computing a phase difference of the fat images, applying a scaling term to the phase difference output; and generating a temperature change map from the phase difference output. A display device may be used for displaying the one or more water images and optionally one or more fat images of the object allowing an operator to view the images.

Figure 10:
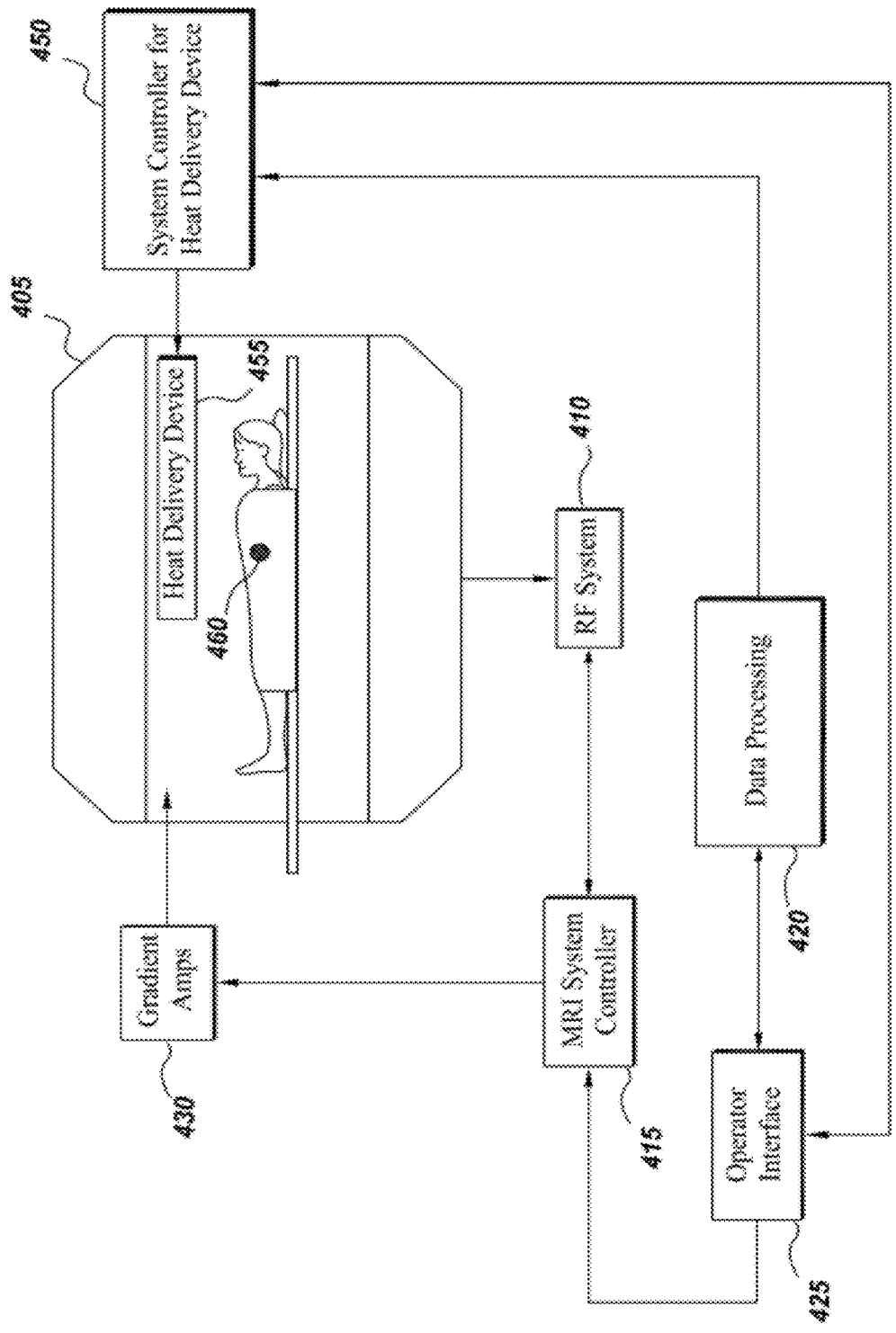
FIG. 10 depicts an application of the temperature mapping system according to one proposed embodiment.

One such embodiment is shown in FIG. 10. As shown, the system may be controlled by an operator interface 425, which is operationally connected to a processor 420. The operator interface 425 may include a display device, and an input panel for instructions for the MRI system 405 and heating device 455. A single controller may control both the MRI system and heating device, or separate controllers may be used, as shown in FIG. 10: MRI controller 415 and heat delivery device controller 450. The MRI system controller 415 sends signals to the gradient amps 430 and exchanges transmit and receive information from the RF system 410. The processor 420 acquires data from the controller for image reconstruction and temperature map computations. The computed temperature map information and confidence maps are fed into the system controller for heat delivery device 450 and to the operator interface display 425. This information and operator provided information may be used to optimally control the heat delivery device 455 in order to optimally treat the desired treatment zone 460.

In certain embodiments, the heat delivery device is used for thermal tumor ablation. The energy source of the ablation device may be radiofrequency (RF), microwave, laser, or high-intensity focused sonography.

The device and methods described may be useful in tumor ablation therapies for benign or malignant tumors. Tumors include, but not limited to, breast, brain, prostrate, lung, liver, uterine, renal, or combinations thereof.

The device and methods described may be useful in for measurement and monitoring of Specific Absorption Rate (SAR) during conventional MRI scans. One such method is to estimate SAR from MRI measured temperature rise.

EXPERIMENTAL

Figure 11:
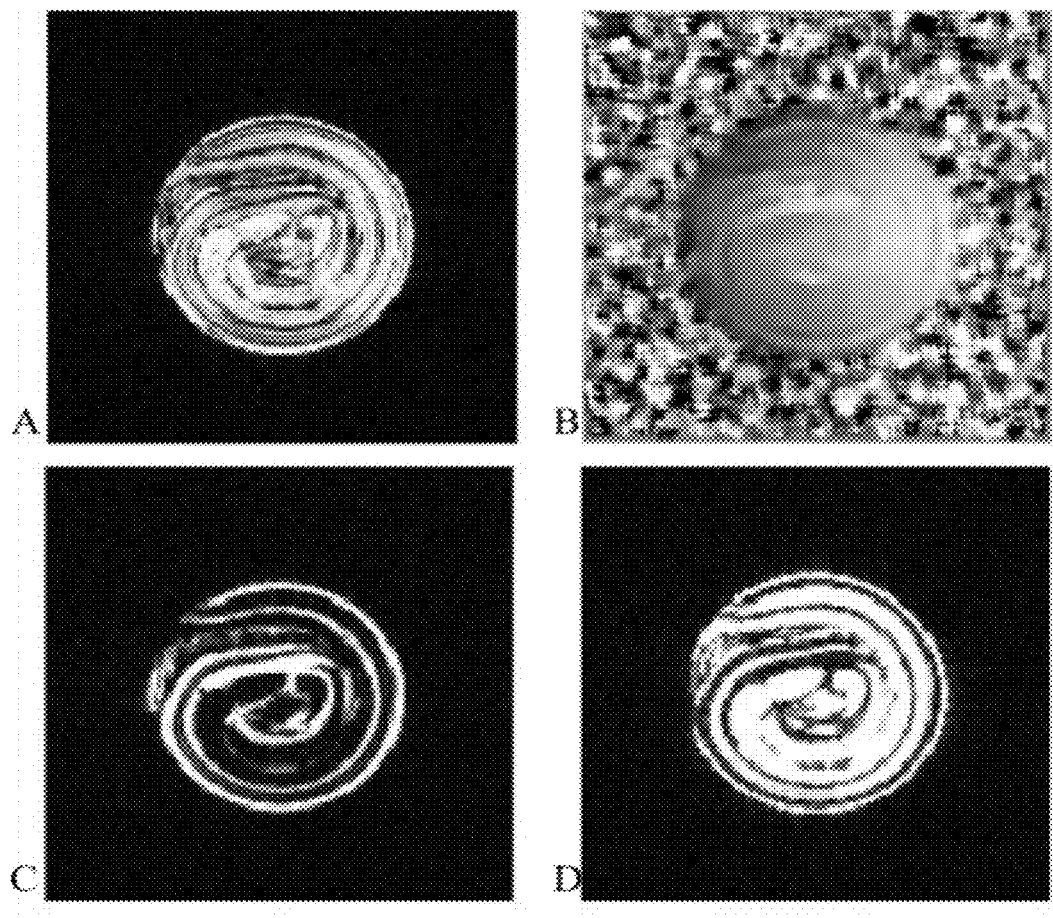
FIG. 11 depicts MRI images of the tissue sample; (A) is the magnitude of complex image $S_1$ acquired at echo time ($\tau$=11.9 ms), (B) is the static magnetic field map ($\hat{\psi}_o$) acquired at time $t_a$. (C) is the magnitude of the reconstructed fat image ($\hat{F}$) acquired at time $t_a$, and (D) is the magnitude of the reconstructed water image ($\hat{W}$) acquired at time $t_a$.

A cylindrically shaped (11 cm diameter, 12 cm length) ex vivo porcine tissue sample was uniformly heated to 51° C. in a hot water bath. Once heated the sample was removed from the water bath and MRI imaging was performed as the sample cooled to room temperature. Four different MRI temperature-mapping measurements were used to monitor temperature change of tissue sample as it cooled. Approach A and B algorithms were used to generate water and fat images for each image series l. Equation 21 was used, where C=Φ, to generate fat-referenced temperature change maps. Measurement was compared to the conventional phase difference method. FIG. 11 depicts MRI images of the tissue sample.

Image (a) is the magnitude of complex image $S_1$ acquired at echo time ($\tau$=11.9 ms). Image (b) is the static magnetic field map ($\hat{\psi}_o$) acquired just prior to start of temperature monitoring at time $t_a$. Image (c) is the magnitude of the reconstructed fat image ($\hat{F}$) acquired at start of temperature monitoring, and image (d) is the magnitude of the reconstructed water image ($\hat{W}$) acquired at the start of temperature monitoring. The quantities $\hat{F}$ and $\hat{W}$ were computed using Approach A from the three images ($S_{-1}$, $S_0$, $S_1$) acquired at echo times ($\tau_o-\Delta\tau$, $\tau_o$, $\tau_o+\Delta\tau$) such that $\tau_o$=13.1 ms and $\Delta\tau$ satisfied Equation 5 where m=1 was used.

Figure 1:
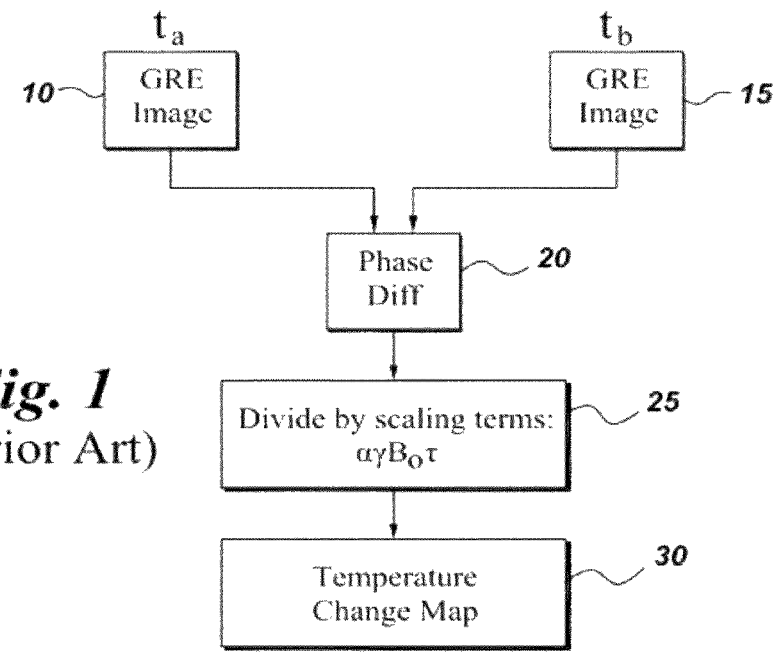
FIG. 1 illustrates a prior art diagrammatic view of a phase difference temperature mapping technique.

FIG. 12 depicts data from the MRI computed temperate maps. MM measured temperature change values were averaged over a 3×3 pixel region of the tissue sample. This average value was plotted in FIG. 12 with respect to time. Plot 530 represents the conventional phase difference MRI thermometry method for measuring temperature as depicted in FIG. 1. Plot 520 represents a three echo implementation of Approach A where $\tau_o$=13.1 ms was used and echo spacing was determined by Equation 5 where m=1. This Approach provided measured values for $\hat{W}$ and $\hat{F}$ at each measurement point. Temperature change was computed using Equation 21 where C=Φ. Φ was computed by fitting a 2D spatially varying second order polynomial to the quantity Arg{$\hat{F}_b\hat{F}_a^*$} for each measurement.

Plot 510 represents Approach A image reconstruction, and temperature change computed in the same fashion as Plot 520, but now with $\tau_o$=12.8 ms.

Plot 540 represents a three echo implementation of Approach B. A symmetric echo spacing was chosen wherein the spacing was such that the phase of the fat image shifted by π/3 for each different echo. Echo timing of (11.71 ms, 12.50 ms, 13.29 ms) was used. $\hat{W}$ and $\hat{F}$ were estimated by solving the over determined system of equations using a least squares estimate approach. Fat referenced temperature change was computed using Equation 21 where C=Φ. Φ was computed by fitting a 2D second-order spatially varying polynomial to the quantity Arg{$\hat{F}_b\hat{F}_a^*$} for each measurement. As shown in FIG. 12 all three fat-referenced techniques (510,520,540) are clustered at roughly the same spot for both Approach A and B. Measurement accuracy coincided with the phase difference method 530.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for processing a temperature map of an object subjected to magnetic resonance (MR) imaging, comprising:
    generating l series of k MR images (S), said images each with echo times ($\tau$) varied such that fat and water images can be generated, wherein;
    l is an integer equal to or greater than one;
    k is an integer equal to or greater than two; and
    each series of MR images is acquired at a time point (t) and echo time $\tau_o$ denotes an average or median echo time of images (S) in each series (l);
    generating a reference phase map image ($\hat{\psi}_o$) of said object wherein said phase map is an image representing magnetic field inhomogeneity of said object at a single time point ($t_a$);
    applying a reconstruction algorithm to each series (l) of said MR images (S) and to the reference phase map image ($\hat{\psi}_o$) to construct a water image ($\hat{W}$) and optionally a fat image ($\hat{F}$) of the object, for each series (l);
    generating the temperature map from the water image ($\hat{W}$) and optionally the fat image ($\hat{F}$) of the object, for each series (l) wherein said temperature map depicts temperature change ($\Delta T$) relative to a reference temperature ($T_{ref}$) or an absolute temperature ($T_{absolute}$) of said object.

2. The method of claim 1 wherein k is equal to 3 and wherein $\hat{W}$ and $\hat{F}$ for each series l are generated according to:

$$\hat{W} = \frac{I_w}{2};$$

$$\hat{F} = \frac{I_f}{2};$$

wherein $$I_w = \frac{\hat{S}_{-1} + \hat{S}_1}{2} + \hat{S}_0;$$

$$I_f = \frac{\hat{S}_{-1} + \hat{S}_1}{2} - \hat{S}_0;$$

$$\hat{S}_n = S_n e^{-i2\pi\sigma\tau_n};\text{ and}$$

$S_n$ is the complex valued MR image for a specific voxel acquired at echo time $\tau_n$ wherein said echo time ($\tau_n$) for images ($S_{-1}$, $S_0$, $S_1$) are ($\tau_o-\Delta\tau$, $\tau_o$, $\tau_o+\Delta\tau$);

$\Delta\tau$ is difference in echo times defined as;

$$\Delta\tau = \frac{\pi(2m-1)}{\gamma B_0 \delta_{fw}};$$

and $\delta_{fw}$ is a chemical shift of fat referenced against water at temperature $T_{ref}$;

m is an integer equal to or greater than one;

$\gamma$ is a gyromagnetic ratio; and $B_0$ is static magnetic field strength.

3. The method of claim 1 wherein k is greater than or equal to 2 and $\hat{W}$ and $\hat{F}$ for each series l are estimates of quantities W and F wherein:

$$\hat{S}_n = S_n e^{-i2\pi\sigma\tau_n};$$

and wherein $\hat{S}_n$ is modeled according to;

$$\hat{S}_n = W e^{i\gamma B_0(\delta T+\delta\psi)\Delta\tau_n} + (e^{i\gamma B_0 \delta_{fw}\tau_n}) F e^{i\gamma B_0 \delta\psi \Delta\tau_n};\text{ and}$$

$$\delta_\psi = \frac{2\pi(\psi_o - \hat{\psi}_o)}{\gamma B_0};$$

$S_n$ is a complex valued MR image, for a specific voxel, acquired with echo time $\tau_n$;

$\delta_T$ is the chemical shift of water based matter in the specific voxel referenced against water at temperature $T_{ref}$;

$\delta_{fw}$ is the chemical shift of fat in the specific voxel referenced against water at temperature $T_{ref}$;

$\Delta\tau_n = \tau_n - \tau_o$;

$\psi_o$ is field inhomogeneity at time (t) when image series is acquired $\gamma$ is a gyromagnetic ratio; and $B_0$ is static magnetic field strength.

4. The method of claim 1 wherein k is greater than or equal to 2 and $\hat{W}$ and $\hat{F}$ for each series l are estimates of quantities W and F wherein:

$$\hat{S}_n = S_n e^{-i2\pi\delta_o\tau_n};$$

and wherein $\hat{S}_n$ is modeled according to;

$$\hat{S}_n \approx W + (e^{i\gamma B_0 \delta_{fw} \tau_n})F;$$

$S_n$ is a complex valued MR image, for a specific voxel, acquired with echo time $\tau_n$;

$\delta_{fw}$ is the chemical shift of fat in the specific voxel referenced against water at temperature $T_{ref}$;

$\gamma$ is a gyromagnetic ratio; and $B_0$ is static magnetic field strength.

5. The method of claim 1, wherein generating a temperature map comprises calculating temperature change $\Delta T$ between time points $t_b$ and $t_a$ wherein:

$$\Delta T = \frac{\text{Arg}\{\hat{W}_b \hat{W}_a^*\} - C}{\gamma \alpha B_0 \tau_o}$$

$\hat{W}_b$ is a water image computed from image series acquired at time point $(t_b)$;

$\hat{W}_a^*$ is a complex conjugate of the water image $\hat{W}_a$ computed from image series acquired at time point $(t_a)$;

$\text{Arg}\{\hat{W}_b \hat{W}_a^*\}$ is a phase difference between water images $\hat{W}_b$ and $\hat{W}_a$;

$\alpha$ is a temperature dependent shift term;

$\gamma$ is a gyromagnetic ratio; and $B_0$ is static magnetic field strength; and C is an image equal to the phase difference between the fat images acquired at $t_b$ and $t_a$.

6. The method of claim 5 wherein C is null.

7. The method of claim 5 wherein:

$$C = \text{Arg}\{\hat{F}_b \hat{F}_a^*\}; \text{ and wherein}$$

$\text{Arg}\{\hat{F}_b \hat{F}_a^*\}$ is a phase difference between fat images $\hat{F}_b$ and $\hat{F}_a$;

$\hat{F}_b$ is a fat image computed from an image series acquired at time point $(t_b)$; and $\hat{F}_a^*$ is a complex conjugate of the fat image $\hat{F}_a$ computed from an image series acquired at time point $(t_a)$.

8. The method of claim 7 wherein C is equal to a phase disturbance correction map $\Phi$, and said $\Phi$ is computed by interpolating, extrapolating, or smoothing the factor $\text{Arg}\{\hat{F}_b \hat{F}_a^*\}$, wherein:

$\text{Arg}\{\hat{F}_b \hat{F}_a^*\}$ is a phase difference between fat images $\hat{F}_b$ and $\hat{F}_a$;

$\hat{F}_b$ is a fat image computed from an image series acquired at time point $(t_b)$; and $\hat{F}_a^*$ is a complex conjugate of the fat image $\hat{F}_a$ computed from an image series acquired at time point $(t_a)$.

9. The method of claim 1, wherein l=1 and generating a temperature map comprises calculating absolute temperature $(T_{absolute})$ from $\hat{W}$ and $\hat{F}$ comprising:

generating a water phase image $\phi_w$ from $\hat{W}$ and a fat phase image $\phi_f$ from $\hat{F}$;

processing said $\phi_w$ and $\phi_f$ using phase unwrapping and optionally image interpolation, regularization and smoothing, to produce processed phase images $\phi_w'$ and $\phi_f'$; and calculating absolute temperature according to;

$$T_{absolute} = \frac{\phi_w' - \phi_f'}{\gamma \alpha B_0 \tau_o} + T_{ref};$$

wherein $\alpha$ is a temperature dependent shift term;

$\gamma$ is a gyromagnetic ratio;

$B_0$ is static magnetic field strength;

and $T_{ref}$ is a reference temperature.

10. The method of claim 1 wherein k is greater than or equal to three and echo times of MR images (S) are such that the phase of the fat signal is shifted by an odd multiple of 180° with respect to the water signal for each image.

11. The method of claim 1 wherein $\hat{\psi}_o$ is adjusted for each image series l to account for changes in field inhomogeneity caused by mobility of object, changes in the bulk magnetic susceptibility of object due to heating, or combinations thereof.

12. The method of claim 1, wherein generating the MR images (S) is in vivo.

13. The method of claim 1 wherein the temperature map is used to measure Specific Absorption Rate (SAR) during MR imaging.

14. The method of claim 1 wherein the generating l series of k MR images (S) is used in combination with a heat delivery therapeutic application.

15. The method of claim 14 wherein the heat delivery therapeutic application comprises thermal tumor ablation, hyperthermia treatment, heat activated drug delivery, or a combination thereof.

16. A system to compute a temperature change map from image data acquired from a magnetic resonance imaging (MRI) device equipped with a heat delivery device of said system comprising:

a controller coupled to the MRI device and the heat delivery device, capable of controlling the operation of the MRI device and heat delivery device;

a processor coupled to the controller and capable of;

obtaining two or more images of an object, positioned within the MRI device, at two or more time points;

obtaining a reference phase map of said object wherein said phase map is a static image representing magnetic field inhomogeneity of said object at a specific time point;

applying a reconstruction algorithm, of said MR images, using the reference phase map to construct one or more water images and optionally one or more fat images of the object;

computing a phase difference output of the water images and optionally computing a phase difference of the fat images;

applying a scaling term to the phase difference output; and generating said temperature change map from the phase difference output; and a display device for displaying the MRI computed temperature map, a water image of said object, a fat image said object, or a combination thereof.

17. The system of claim 16 wherein the processor controls gradient amps being delivered to the MRI device and temperature output of the heat delivery device based on the temperature change map.

18. The system of claim 17 wherein the processor is further capable of generating a confidence map and wherein said generating step comprising computing a water/fat ratio of at least one of the time points.

19. The system of claim 17 wherein the heat delivery device is a thermal tumor ablation device, a hyperthermia treatment device, a heat activated drug delivery device, or a combination thereof.

20. The system of claim 19 wherein the heat delivery device delivers energy in the form of radiofrequency (RF), microwave, laser, or high-intensity focused sonography.

* * * * *